United States Patent [19]

Thorpe et al.

[11] Patent Number: 4,806,892

[45] Date of Patent: Feb. 21, 1989

[54] INCLINED RF CONNECTING STRIP

[75] Inventors: J. Carlton Thorpe, Poway; Francis X. Konsevich, Carlsbad, both of Calif.

[73] Assignee: TRW Inc., Redondo Beach, Calif.

[21] Appl. No.: 118,820

[22] Filed: Nov. 9, 1987

[51] Int. Cl.⁴ .............................................. H01P 1/04
[52] U.S. Cl. .................................... 333/246; 333/260
[58] Field of Search .............. 333/260, 247, 246, 238, 333/1

[56] References Cited

U.S. PATENT DOCUMENTS

| | | | |
|---|---|---|---|
| 3,579,206 | 5/1971 | Grange | 333/260 X |
| 4,113,981 | 9/1978 | Fujita et al. | 174/68.5 X |
| 4,255,613 | 3/1981 | Ketchpel | 174/68.5 X |
| 4,600,907 | 7/1986 | Greilman et al. | 333/260 X |
| 4,680,557 | 7/1987 | Compton | 333/238 X |

OTHER PUBLICATIONS

Patrick, R. M.; "Flexible Strip Transmission Line"; *IBM Technical Disclosure Bulletin;* vol. 2, No. 6, Apr. 1960; pp. 35, 36.

*Primary Examiner*—Eugene R. Laroche
*Assistant Examiner*—Benny T. Lee
*Attorney, Agent, or Firm*—Ronald M. Goldman; Robert W. Keller

[57] ABSTRACT

A microstrip type transmission line connects RF signals between separate spaced microwave components and defines a RF connecting strip having a flexible insulator base and a ski slope shaped geometry. The RF connector includes a thin wide strip of dielectric material, a first thin narrow flat electrical conductor containing a tab portion extending beyond the front end of said dielectric material; a second thin wide electrical conductor having first portion covering the underside of said dielectric strip, said conductor being greater than said length of said dielectric layer to define first and second tab end portions extending beyond the end of said dielectric material; said first and second conductors being attached to said dielectric material and together therewith forming a sandwich, said sandwich having a first bend located at a position between the front and back ends of said dielectric to form a first straight portion and a second straight portion forming an incline; and, further containing, a second bend located proximate the front end of said dielectric to form a straight portion extending parallel essentially to said first portion thereof.

9 Claims, 2 Drawing Sheets

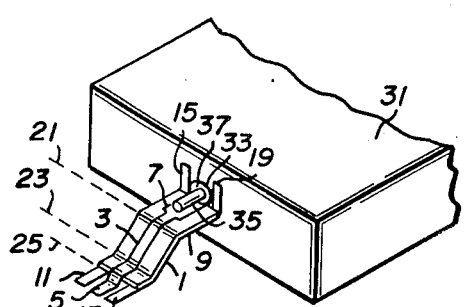
Fig_1
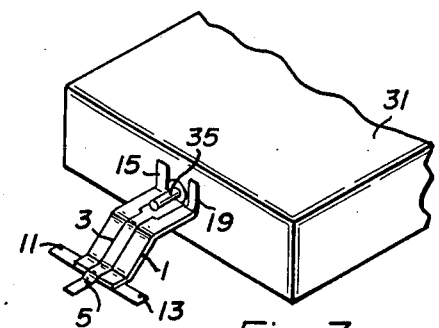
Fig_3
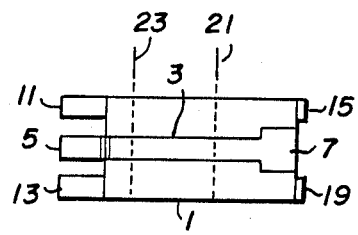
Fig_2a
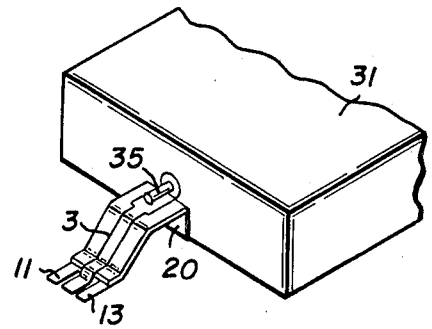
Fig_4
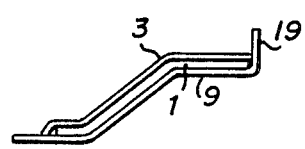
Fig_2b
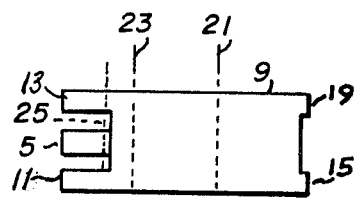
Fig_2c
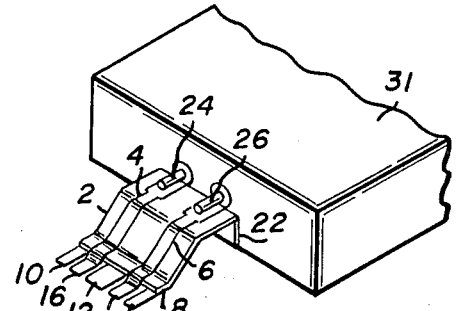
Fig_5
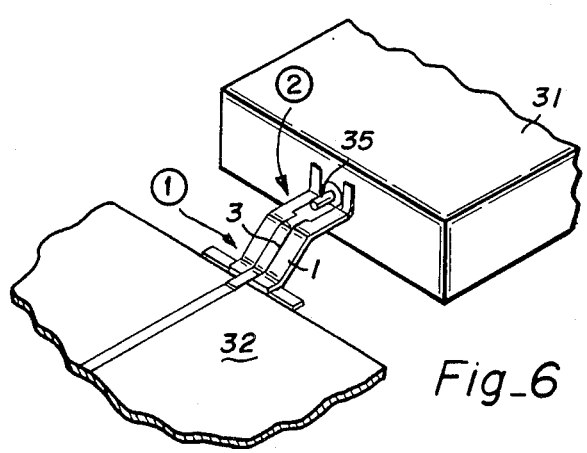
Fig_6

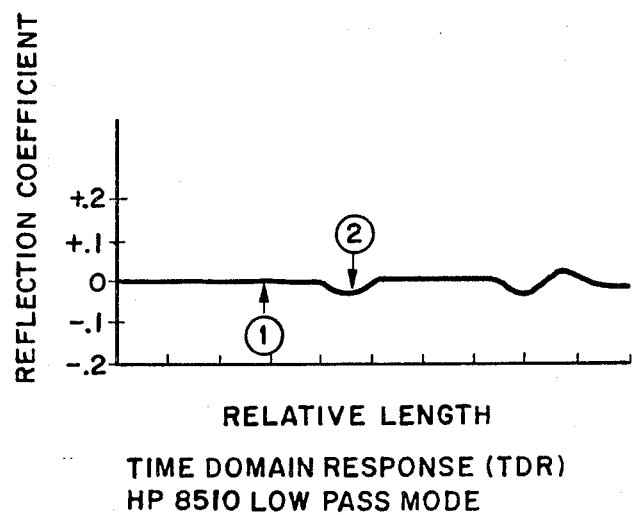
*Fig_7a*
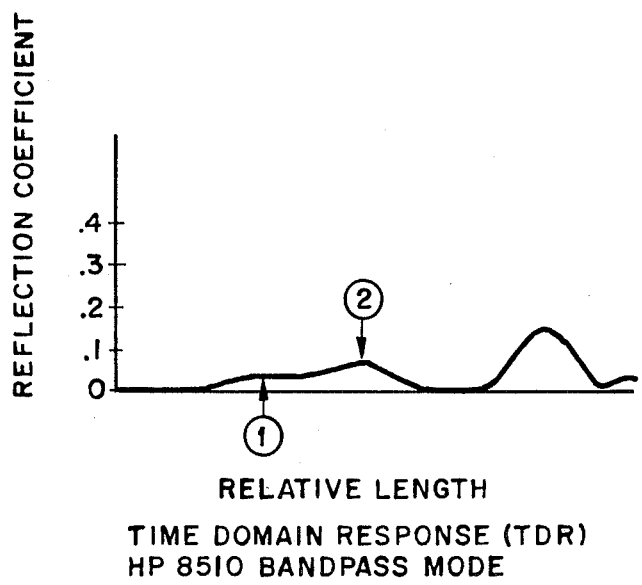
*Fig_7b*

INCLINED RF CONNECTING STRIP

FIELD OF THE INVENTION

This invention relates to RF transmission lines for coupling RF energy between discrete circuit components and, more particularly, to an RF connecting strip of small physical size for use in a temperature variable high shock and vibration environment.

BACKGROUND

Beginning with the advent of electrical generation and consumption, electrical conductors, wires, termed transmission lines, have been used to carry electrical power from the place of generation or storage to the device, the "load", which uses or consumes that power. The transmission line structure varies in its form, in part depending upon the kind and type of electricity that is being carried and the particular environment through which it passes. At high alternating current frequencies, RF, and above, such as in the range of 2 thru 18 GHz, the transmission lines, more particularly the "RF" transmission lines, used for this purpose generally include waveguide, coaxial, parallel wire (micro strap) and micro strip transmission lines all of which contain two conductors, one of which is regarded as the electrical "common" or "ground". The general structure and characteristics of those RF transmission lines are known to those skilled in this art.

In many cases the RF transmission line carries RF electricity over long distances, and in other cases not. As known to those skilled in the art, the transmission line is also used to connect RF energy between individual component elements within a particular electronic device, such as components in an electronic amplifier, that are located perhaps no more than an inch or two apart. In these applications, the connecting transmission line may be referred to as an RF connecting strip. The present invention addresses a new structure for an RF connecting strip.

The general purpose of the electrical roadway, s to speak, is to carry the RF energy from one location to another reliably and with minimal loss and maximum transfer of the electrical energy.

To the designer, one important property of a transmission line is its characteristic impedance, Zo. That impedance is dependent upon the physical structure and dimensions of the conductors, the dielectric constant of the insulating materials separating the conductors and the conductivity of the wire itself. Maximum power is transferred between the transmission line and the electrical device which is to receive the electricity, the "load", when the lines characteristic impedance is equal to the impedance of the load. Power transfer is important for several reasons. If power is lost either by dissipation or by reflection, due to impedance mismatch with the load, the power may need to be made up in other ways, such as by the addition of power amplifiers. This is a "fix" that is expensive, adds additional complexity, size, and weight to the equipment; all important factors in the useful electronic arts. In addition, the energy reflected due to a mismatched interface interacts with the forward energy forming a frequency dependent amplitude characteristic. This frequency dependent amplitude characteristic or amplitude ripple can be very difficult to eliminate and can seriously degrade the performance of microwave systems.

Temperature plays a role in the design and use of transmission lines and electronic amplifiers and the like. As temperature increases, it usually causes materials to expand or lengthen and different materials do so to different degrees. Conversely when the temperature drops, the materials contract. This causes mechanical stress cycling of the electrical interface structure for which the designer must account. Moreover repeated temperature cycling of the equipment results in repeated expansion and contraction which will result in material fatigue and might cause electrical connections between parts of the electrical transmission circuit to break and open, rendering the circuit inoperative. Since repair is always time consuming and expensive, if the connections withstand that cycling, the advantages are obvious. Stresses of the type described above in connection with temperature can also result from exposure to mechanical shock and vibration environments. The subject invention provides essential stress relief to preclude the former from impairing the integrity of the electrical connections.

One may select conductors from an innumerable list of metals and alloys, the dielectric from a similar host, the geometry, the length and so on; and such variables present infinite possibilities to the designer. The present discovery, if viewed as an extraction from the realm of infinite possibilities of lines with RF power connecting possibilities, is of a singular structure that provides reliable coupling in the hostile environment described with negligible effect upon the electrical transmission characteristics. The novel transmission line maintains a relatively constant RF characteristic as the environment and the transmission line and associated system undergoes physical changes due to thermal and mechanical effects upon the line and upon the associated equipment with which it is connected, and is both simple and inexpensive. The present invention enhances the reliability of the electronic circuits of which they form a part, resulting in lesser initial construction cost and/or eventual maintenance cost, and maintains those circuits true to the optimum design performance parameters.

One example of a simple RF interconnection for discrete electronic components is presented in U.S. Pat. No. 4,600,907 granted July 15, 1986 to Grellman et al. In Grellman a connection for two semiconductor devices uses a co-planar microstrap waveguide that includes a plurality of thin straps of conductive metal embedded in a polyimide substrate, an electrical insulator, and is dimensioned to exhibit the electrical transmission characteristic of a co-planar waveguide. At one end, the strips are bonded to one component and at the other to the leads on a circuit board to which the component is attached. The strip forms an incline extending from one level to the circuit board at a lower vertical level. The co-planar line in Grellman is useful in applications in which a ground plane or ground connection is not accessible. Not only is the ground plane of the devices in those applications unavailable, but the substrate is usually fabricated of a hard material with thermal expansion characteristics similar to that of the die thereby minimizing thermal stresses and allowing direct inflexible die bond attachments of the microwave semiconductor strip.

In the present invention, the connection strip is designed for a low loss, low voltage standing wave ratio interconnection between soft microstrip substrates and rigidly mounted microwave devices thereby requiring mechanical flexibility characteristics. The particular arrangement in Grellman interconnects a chip to a hard substrate and thus requires a minimum of mechanical stress relief. Grellman thus does not address the need for an effective microstrip interconnection that addresses the problem that has plagued the microwave industry: The need for a connection strip design that is simple and inexpensive to fabricate and that, simultaneously, solves the electrical and mechanical performance problems in an environment where wide changes in temperature occur and mechanical shock and vibration are present. Not only does Grellman present a different structure, that structure is designed for application in a different environment than that intended for the present invention. Other representative connecting strip transmission line structures used to couple microwave energy between circuit elements appear in the patent literature. This includes U.S. Pat. No. 4,288,761 granted Sept. 8, 1981 to Hopfer, U.S. Pat. No. 4,280,112 granted July 21, 1981 to Eisenhart, U.S. Pat. No. 4,260,963 granted Apr. 7, 1981 to Drapac, U.S. Pat. No. 3,969,689 granted July 13, 1976 to Corrons, U.S. Pat. No. 4,001,834 granted Jan. 4, 1977 to Smith and U.S. Pat. No. 3,806,767 granted Apr. 23, 1974 to Lehrfeld.

A principal object of the invention is to provide a new physically minute microstrip type RF connecting strip and to provide a combination of discrete components and an RF connecting strip connected between those components. A further object of the invention is to provide an RF connecting strip that is of simple geometry, which may be easily fabricated and which possesses RF transmission characteristics at a given frequency that do not change in any significant degree when the ends are pulled to change the strip's geometry or compressed to do so. A still further object is to provide an RF connecting strip that is capable of attachment to discrete components and, as attached, is capable of withstanding repeated stress and compression during repeated temperature cycling and exposure to mechanical shock and vibration without separating from the components to which the strip is attached.

SUMMARY

A microstrip type transmission line connects RF signals between separate spaced microwave components and defines a RF connecting strip having a flexible insulator base and a ski slope shaped geometry. The strip withstands the stress, compression and bending resulting from temperature change and dynamic mechanical effects upon the strip and the associated components to which the strip is attached and maintains essentially constant electrical transmission characteristics, avoiding significant impedance mismatches. The RF connecting strip includes a thin wide strip of dielectric material, a first thin narrow flat electrical conductor containing a tab portion extending beyond the front end of said dielectric material; a second thin wide electrical conductor having first portion covering the underside of said dielectric strip, said conductor being greater than said length of said dielectric layer to define first and second tab end portions extending beyond the end of said dielectric material; said first and second conductors being attached to said dielectric material and together therewith forming a sandwich, said sandwich having a first bend located at a position between the front and back ends of said dielectric to form a first straight portion and a second straight portion forming an incline; and, further containing, a second bend located proximate the front end of said dielectric to form a straight portion extending parallel essentially to said first portion thereof.

The foregoing and other objects and advantages of the invention together with the structure characteristic thereof, which was only briefly summarized in the foregoing passages, becomes more apparent to those skilled in the art upon reading the detailed description of the preferred embodiments, which follows in this specification, taken together with the illustrations thereof presented in the accompanying drawings.

BRIEF DESCRIPTION OF THE DRAWINGS

In the drawings:

FIG. 1 illustrates an embodiment of the invention in perspective view;

FIGS. 2a, 2b and 2c illustrate in an enlarged scale and slightly exaggerated proportion the embodiment of FIG. 1 in top plan view, right side view, and bottom plan view, respectively;

FIG. 3 illustrates in perspective view a second embodiment of the invention;

FIGS. 4 and 5 illustrate two additional embodiments;

FIG. 6 illustrates the embodiment of FIG. 1 as assembled in a transmission system; and FIGS. 7a and 7b illustrate the reflection characteristics of a specific embodiment.

DETAILED DESCRIPTION OF THE EMBODIMENTS

The RF connecting strip illustrated in FIG. 1 includes a thin flat elongated strip 1 of insulating material of a predetermined length atop which is attached a centrally located relatively narrow thin flat conductor 3 that extends the length of the insulator strip and beyond. Conductor 3 includes a front tab portion 5 which extends beyond the front edge of insulator 1, is downwardly bent and forwardly extends. An enlarged width portion 7 or pad is formed to define a pad area over the rear end of the insulator strip. A thin conductive strip 9 is attached to and covers the underside surface of insulator 1, although that conductor is not fully visible in this view, and extends beyond the front and rear ends of the insulator strip. The conductive strip, insulator and underside conductor, elements 1, 3 and 9, form a microstrip transmission line.

A pair of tabs 11 and 13 extend from the main portion of the bottom conductor beyond the front end of the insulator strip. The tabs are evenly and equally spaced from tab 5 belonging to center conductor 3. An additional pair of tabs 15 and 19 integrally formed in conductor 9 extends from the rear edge of the insulator. Tabs 15 and 19 are oriented or bent perpendicular to the adjoining conductor and insulator strip surface, forming a right angle with the plane of the adjoining portion of the insulator and extending vertically upwardly. The sandwich of the two conductors and the central insulator contains two bends, as represented by the bend lines 21 and 23. In this embodiment, by way of specific example, the first bend is located approximately midway of the length of the insulator, and the second bend is located approximately ⅞ths the length of insulator from the insulators front end as illustrated in the figure. Other bend locations may be selected. The insulator as shown has its rear portion elevated in position relative to a front portion and both portions extend horizontally parallel to one another. The intermediate portion of the strip forms a straight incline between the front and rear portions, resembling a ski slope.

The central conductor tab 5 contains a further bend, represented by bend line 25 and the conductor is formed downwardly over the front edge of insulator 1 and extends forwardly in a plane containing and parallel to tabs 11 and 13 of the bottom conductor strip.

The sandwich, though flexible, retains its transmission line characteristics when it is bent and twisted by the mechanical movement of the devices it interconnects. Fabrication of the interconnecting strip is accomplished using standard photo imaging, chemical etching and laminating techniques followed by a relatively simple forming and trimming operation. Forming and trimming of the strip is accomplished at ambient temperature using a die.

A microwave component package 31 is partially illustrated in perspective. The package includes an opening 33 through which extends a metal pin 35 of a non-critical length, typically 0.05 to 0.2 inches. This pin is separated, hence, electrically insulated from the metal walls of container 31 by a coaxial insulator 37. The metal walls of the case are of metal to shield the internal elements and prevent internal RF radiation from escaping and causing interference with other equipment and vice-versa. Simultaneously the metal walls serve as the electrical ground for the unit. The active RF signal is coupled in or out of the component via pin 35.

At the rear end, the center and bottom conductors are attached, respectively, to both the output pin 35 and the case as follows: Pin 35 is soldered in electrical conductive relationship with the enlarged pad portion 7 of center conductor 3, and, alternatively, may be adhesively bonded or welded. This forms a strong physical and electrical connection. The conductor is attached at the furthermost edge, which is most important, to ensure that the RF signals are coupled at that location. In like manner, tabs 15 and 19 are soldered, adhesively bonded or welded to the case. Again the most critical area of connection necessarily is that area located adjacent the bend line in the tabs. The upwardly extending tabs also serve to prevent electrical contact between the enlarged portion of conductor 7 and the side walls of the case, serving as a spacer that maintains a distance equal to the tab's thickness. The arrangement illustrated allows electrical ground and the RF signal to be coupled at essentially the same locations at the rear end of the conductive strip, differing only by the distance of the thickness of the tabs. This is in keeping to the ideal design requirement of having an equal length to both portions of the transmission line.

At the front end, the tabs 11 and 13 are connected to conductors on a circuit board, not illustrated in this figure, and the center conductor 5 is likewise connected to a conductor lying on the same circuit board.

The top, side, and bottom views of the embodiment of FIG. 1 are respectively presented in FIGS. 2a, 2b, and 2c and illustrate more clearly some of the relationships between the elements previously described. These views are drawn to a slightly larger scale than the illustration of FIG. 1 and, moreover, the thickness of the conductors are slightly exaggerated, that is, increased in respect to the thickness of the insulator so as to allow better illustration. In the specific example given, the thickness of the insulator is approximately twenty five times as great as the thickness of the top conductor and between five to twenty five times as thick as the bottom conductor.

At the rear end of insulator strip 1 to the right side of FIG. 2a, the top ends of the vertically directed tabs 15 and 19 are visible. As shown the thickness of these tabs serves to space the rear end of the center conductor strip 3 from the flat wall of any metal container to which the tabs are attached such as component 31 in the preceding figure, leaving an electrically insulative "air gap" therebetween that prevents electrical contact. The location of the bend lines 21 and 23 in respect to the front and rear ends of the insulator strip is more clearly illustrated in this figure.

As shown in FIG. 2b, the insulator strip contains a front portion of short length, the minor portion, and a rear portion of greater length, the major portion, as delineated by the location of the bend lines. These two portions are parallel, both extending horizontally in the figure. The two portions are also laterally displaced from one another. An intermediate portion, integral with and located between the first two described portions, thus forms an essentially straight incline extending from the elevated vertical level of the rear portion to the lower vertical position of the insulator strips front portion; the geometry resembling a ski slope angled at approximately 45 degrees in the embodiment.

As illustrated in FIG. 2c, the bottom conductor is wide enough to cover the entire surface of the insulator strip.

By applying compressive forces to opposed ends of the bottom conductor, the assembly may flex further along the bend line 21 and upon release of the force, restore to its original shape illustrated due to the flexibility of the insulator strip. A pulling force between the ends causes a straightening of the bend, which again causes a spring like restoring force upon termination of that pulling force.

In one specific example, an RF connecting strip constructed according to the invention, the overall length of the insulator is 0.4 inches, the width 0.15 inches and the thickness 0.025 inches. The bend angle formed at 21 was approximately 45 degrees as is the bend angle at bend line 23. The insulator employed was Rogers 6010 "Duroid" material, a brand of polytetrafluoroethylene. The center conductor has approximate thickness 0.001 inches and width 0.025 inches with the width of the enlarged portion 7 approximately 0.040 inches. The center conductor is made of copper which has been overplated with silver or gold. The thickness of the bottom conductive layer and the associated tabs was approximately 0.001 and 0.005 inches respectively. The width of the tabs 15 and 19 were 0.04 inches and the width of the tabs 11 and 13 were 0.04 inches and spaced approximately 0.02 inches from the center conductor. The approximate vertical distance between the front and rear portions of the insulator strip was 0.15 inches.

In operation, RF signals are coupled from component 31 via lead 35 which makes the direct contact at the furthermost end of the center conductor. The bottom conductor serves as a ground plane; in effect the RF connecting strip forms a member of the class of transmission lines known as microstrip transmission lines in which the ground plane underlies the conductor that carries the active RF signal. Should the temperature change so that the relative distance between the component 31 and the associated printed circuit board, not shown, change in length or spacing, including the length of the sandwich, the overall electrical characteristics of the transmission line and interface will not change significantly. Thus the component 31 may move further away from the circuit board and the RF connector stretches and unbends slightly. As the temperature returns to normal, the inherent flexibility allows the sandwich to return to its original shape. Likewise when the two components are moved closer together, the bend is heightened. It is expected that repeated cycling of the sandwich in the circuit or system will not result in breaking of the connection either to the case 31 or the associated circuit board or between the conductors and the insulator strip. This assembly is a reliable transmission line capable of long term operation over a wide temperature range and induced movement and can be tailored to meet a wide variety of environmental conditions.

As those skilled in the art appreciate, the elements may be varied to form additional embodiments some of which are illustrated in the succeeding figures to which reference is made and in which similar elements are identically labeled. Referring to FIG. 3, tabs 11 and 13 in this embodiment extend along a line parallel to the edge of insulator 1 in which arrangement the conductors are attached to a ground plane line associated with the printed circuit board, not illustrated. In other respects the element and the associated devices to which this is attached are the same as in the prior embodiment and need not be further described.

In FIG. 4 the RF connecting strip includes a downwardly directed tab 20 which is substituted for the upwardly extending tabs 15 and 19 of the prior embodiment. This tab forms a singular rectangular extension, which is not fully illustrated, and is attached or bonded to the component case 31. As in the first embodiment it is most critical to make an electrical and mechanical connection between the case and the tab at the location of the bend. In all other respect the RF connecting strip of this embodiment is the same as that of the embodiment of FIG. 1.

In the preceding embodiments, the RF connecting strip serves to couple only a single electrical lead. Multiple lead constructions are possible such as is illustrated in the embodiment of FIG. 5 to which reference is made. The connector includes a thin flat insulator 2 containing a pair of spaced strip like conductors 4 and 6 and an underlying conductor 8, not fully illustrated in this view, preformed into a self supporting shaped structure as illustrated. The bottom conductor contains at the front end of insulator 2, three extending tabs 10, 12 and 14 while the front ends of the conductors 4 and 6 contain tab ends 16 and 18 with the tabs spaced from one another at the rear end of the insulator a downwardly extending strip 22 extend at right angles to the plane of the insulator at that location and is firmly attached at the area of the bend to case 31. The electrical pins or leads 24 and 26 extend out of the case for attachment to the enlarged end of the respective conductive strip 4 and 6 the attachment being most critical at the location nearest edge of the insulator. The downwardly extending tab 22 functions also as a spacer to prevent the wide ends of the conductive strips 4 and 6 from contacting the metal portions of the case, separating the latter by a distance approximately equal to the thickness of the tab.

As in the preceding embodiment, the underlying conductor covers the entire bottom surface of the insulator. In other respects including the thickness and kind of materials employed, the length, the location of the bends and the bend angles are similar to that employed in connection with the embodiments in FIGS. 1 and 3.

FIG. 6 illustrates partially a system that contains the connector embodiment of FIG. 3 connected between a component 31 and a microstrip type board 32. As illustrated in FIGS. 7a and 7b, certain tests were undertaken which measured the reflection coefficient of the connector strip illustrated in FIG. 6 and provided figures of that coefficient as a function of length in the transmission line. For ease of reference the results depicted at and between the locations denoted as encircled numbers 1 and 2 in each of FIGS. 7a and 7b represent the corresponding locations, encircled numbers 1 and 2, in FIG. 6. Measurement apparatus known to those skilled in the art for measuring electrical characteristics of microstrip transmission lines includes the Hewlett Packard network analyzer, marketed as the HP8510. The HP8510 analyzer was used to measure the reflection coefficient of a specific embodiment of the connector strip in both the "loss pass" and "bandpass" modes, and confirmed positive results. The reflection coefficient in the HP8510 Low Pass mode was under ±0.05; the reflection coefficient in the HP 8510 bandpass mode approximately 0.075 at the interconnect strip to device interface (position 2) and less at the intermediate locations. This electrical or RF performance is ideal and should be recognized by those skilled in the art as an accomplishment.

The invention demonstrates physical simplicity in a system having small physical size and complex high frequency characteristics where variations usually cause material changes. The product may be fabricated using standard printed circuit type fabrication techniques and may be formed to shape and trimmed by machine thus insuring a consistency from connector to connector in a batch. When all of the dimensions thus set, the technician who is called upon to install the elements in a circuit need only drop the connector into place and properly make the correct solder, adhesive or welded connections.

Although there is described a particular shape and bend angle, as those skilled in the art recognize upon reading this specification, other configurations are possible which will provide the desired mechanical flexibility. Further, although the arrangement is of a given length, a connector according to the invention may be made of a greater or shorter length and be within the scope of the teachings contained in this specification.

Although the length of the configuration in the specific example given is less than one-half inch, which is less than the width of an ordinary persons thumb, it is anticipated that the arrangement can be made in lengths up to three quarters of an inch or more and retain the advantages described. Moreover, although polytetrafluoroethylene material is used as the insulator in the described embodiments, it is expected that other dielectric materials, such as polyimide material, may be substituted in that combination. Although polyimide materials are inherently more stiff than "Duroid" material, the material is capable of being etched chemically and, thus, permits more expeditious fabrication techniques as is apparent to those skilled in the art.

It is believed that the foregoing description of the preferred embodiment of the invention is sufficient in detail to enable one skilled in the art to make and use the invention. However, it is expressly understood that the details of the elements which are presented for the foregoing enabling purpose are not intended to limit the scope of the invention, in as much as equivalents to those elements and other modifications thereof, all of which come within the scope of the invention, become apparent to those skilled in the art upon reading this specification. Thus the invention is to be broadly construed within the full scope of the appended claims.

What is claimed is:

1. A microstrip transmission line of the type containing a ground plane conductor for connecting RF energy between discrete spaced electrical components in an RF system for providing a relatively constant transmission characteristic over a predetermined range of temperature, vibration and shock, comprising:

an elongated thin insulator strip containing upperside and underside surfaces and front and rear ends and being of a first predetermined length, said insulator strip being of flexible electrically insulative material;

said insulator strip further containing: a first horizontal front end portion of a second predetermined length; a second horizontal rear end portion of a third predetermined length, said length of said second portion being greater than said length of said first portion and said second portion being vertically elevated with respect to and laterally spaced from said first portion; and a third intermediate portion of a fourth predetermined length integrally connected between said first and second portions forming an essentially straight incline surface therebetween;

first thin narrow flat elongated conductor strip means of electrically conductive material, said conductor strip means having a length greater than said first predetermined length of said insulator strip;

said first conductor strip means having a major portion attached to and support on the upper surface of said insulator strip and extending from a location at the rear end of said insulator strip to the front end of said insulator strip; said conductor strip further having a tab end portion extending beyond the front end of said insulator strip, said tab end portion containing a bend located at the front end of said insulator strip and being located vertically below said upperside surface of said insulator strip;

second thin flat conductor strip means, said second conductor strip means being of a length greater than said length of said insulator strip and having a major portion attached to and essentially covering the underside surface of said insulator strip;

said second conductor strip means further having a first tab portion located at the rear end of and extending beyond the rear end of said insulator strip, said first tab portion being oriented essentially orthogonal to said second portion of said insulator strip;

said second conductor strip means further having second tab portions located at the front end of and extending beyond the front end of said insulator strip; said second tab portions being oriented essentially coplanar with said tab end portion of said first conductor strip and parallel with the underside surface of said first horizontal front end portion of said insulator strip;

said first and second strip means having the characteristic of being capable of transmitting bending moment, strain and compression forces applied between the ends to cause said insulator strip to flex without detachment of said conductor strips means form the surface of said strip.

2. In an RF system containing a first RF device and a second RF device, said first device being of the type containing an electrically conductive shielded case and having an electrical lead means of predetermined width extending along a predetermined axis through an opening in said case for carrying RF through the walls of said case; said second RF device being of the type having a relatively thin flat insulator surface and containing thereon attached a flat conductor forming an RF path on at least one side of said flat insulator surface; said lead means of said first RF device and said flat conductor of said second RF device being spaced apart vertically between a first vertical level and a second vertical level, respectively; and RF connector means connected therebetween to place said electrical lead means and said flat conductor in electrical series circuit to provide a transmission path for propagation of RF therebetween, the improvement wherein said RF connector means comprises;

a thin wide dielectric strip of dielectric material having front and back ends, said strip being of a predetermined width that is greater in width than said lead means of said first RF device and being of a predetermined length;

a first thin narrow flat electrical conductor having a length, said length of said first conductor being greater than said length of said dielectric strip to define a tab portion to said first conductor extending beyond the front end of said dielectric strip;

said first conductor having a width that is substantially less than the width of said dielectric strip;

said first conductor having an enlarged portion located adjacent the back end of said dielectric strip, said enlarged portion having a width that is greater than the width of said tab portion of said first conductor;

a second thin wide electrical conductor having a first portion covering the underside of said dielectric strip, said second electrical conductor being of a predetermined length, said predetermined length being greater than said length of said dielectric strip to define first an second tab end portions, said tab end portions extending beyond the end of said dielectric strip;

said first and second conductors being attached to said dielectric strip;

said first and second conductors and dielectric strip forming a sandwich with said dielectric strip positioned in between said first and second conductors, said sandwich having:

a first bend, said first bend being located at a position between the front and back ends of said dielelctric strip, to form a first straight portion extending essentially parallel to the axis of said lead means and a second straight portion forming an incline between said first vertical level and said second vertical level; and, further containing, a second bend, said second bend being located proximate the front end of said dielectric strip, to form a straight portion extending parallel essentially to said first portion thereof;

said first bend between the two portions being positioned at a predetermined position between the front and back ends of said dielectric strip;

said first extending tab portion of said second conductor extending in a direction perpendicular to the axis of said lead means of said first RF device and having a surface thereof in electrical contact with said case of said first RF device;

said tab portion of said first conductor having a third bend located at the front end of said dielectric strip to place at least one surface of said tab portion in essentially coplanar relationship with an adjacent portion of said second conductor;

said enlarged end portion of said first conductor being in electrical contact with a cylindrical conductor of said electrical lead means;

said tab portion of said first conductor being in contact with said flat conductor of said second RF device;

said materials of said first and second conductors and said dielectric strip being flexible so as to maintain essentially the same electrical RF characteristics despite changes in the spacing between said flat conductor on said flat surface of said second RF device and said case of said first RF device resulting from thermal expansion or contraction of any of said components; whereby said conductors form a microstrip transmission line.

3. The invention as defined in claim 2 wherein said first extending tab of said second conductor extends vertically upwardly.

4. The invention as defined in claim 2 wherein said first extending tab of said second conductor extends vertically downwardly.

5. The invention as defined in claim 2 wherein said second conductor further contains third and fourth extending tabs; said third and fourth tabs being spaced from one another and from said tab portion of said first conductor with said first conductor tab portion being located in between said third and fourth tabs of said second conductor.

6. An RF coupling strip of the microstrip transmission line type adapted for connection in electrical series circuit between two spaced electrical components, comprising:

a thin wide dielectric strip of dielectric material having front and back ends, said dielectric strip being of a predetermined width and having a predetermined length;

a thin narrow flat electrical conductor having a predetermined length; said predetermined length of said first electrical conductor being greater than said length of said dielectric strip to define a tab portion extending beyond the front end of said dielectric strip;

said first electrical conductor having a predetermined width, said predetermined width of said first electrical conductor being substantially less than the width of said dielectric strip;

said first conductor having an enlarged portion adjacent the rear end of said dielectric strip; said enlarged portion being larger in width than said tab portion;

a second thin wide electrical conductor having a first portion covering the underside of said dielectric strip, said second conductor being greater in length than said length of said dielectric strip to define first and second tab end portions, said tab end portions extending beyond the end of said dielectric strip;

said first and second conductors being attached to said dielectric strip;

said layers of conductors and dielectric forming a sandwich with said dielectric strip located in between said first and second conductors;

said sandwich having a first bend located at a position between the front and back ends of said dielectric strip to form a first straight portion and a second straight portion forming an incline to said first straight portion; and further containing a second bend located proximate the front end of said dielectric strip to form a third straight portion, said third straight portion extending parallel essentially to said first straight portion thereof;

said bend between the two portions being positioned at a predetermined distance between the ends of said dielectric strip;

said first extending tab portion of said second conductor extending in a direction perpendicular to said first sandwich portion;

said front end portion of said first conductor having a third bend located at the front end of said dielectric strip to place at least one surface of said tab end in essentially coplanar relationship with said extending portions of said second conductor; said enlarged end portion of said first conductor being adapted for making electrical contact with a cylindrical conductor;

said materials of said conductors and said dielectric strip being flexible so as to maintain essentially the same electrical RF characteristics despite changes in the spacing between the front and back ends of said dielectric strip resulting from thermal; and said conductors forming a microstrip transmission line.

7. The invention as defined in claim 6 wherein said first conductor, said second conductor and said dielectric strip have first, second, and third predetermined thicknesses, respectively; and wherein said third predetermined thickness is approximately twenty five times as great as said first predetermined thickness and is at least five to twenty five times as great as said second predetermined thickness.

8. The invention as defined in claim 6 wherein said formed transmission line possesses a coefficient of reflection characteristic of less than 0.1 at a predetermined frequency within the range of RF signal conveyed thereby.

9. The invention as defined in claim 6 wherein said dielectric strip is of a length of 0.4 inches and is of a width of 0.15 inches; and wherein said first conductor is of a thickness of approximately 0.001 inches.

* * * * *